United States Patent
Koo et al.

(10) Patent No.: US 9,257,455 B2
(45) Date of Patent: Feb. 9, 2016

(54) GATE DRIVE CIRCUIT HAVING REDUCED SIZE, DISPLAY SUBSTRATE HAVING THE SAME, AND METHOD OF MANUFACTURING THE DISPLAY SUBSTRATE

(75) Inventors: Bon-Yong Koo, Chungcheongnam-do (KR); Sung-Man Kim, Seoul (KR); Jae-Hoon Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 417 days.

(21) Appl. No.: 13/288,893

(22) Filed: Nov. 3, 2011

(65) Prior Publication Data

US 2012/0161820 A1 Jun. 28, 2012

(30) Foreign Application Priority Data

Dec. 27, 2010 (KR) .................. 10-2010-0135278

(51) Int. Cl.
*G09G 3/36* (2006.01)
*H01L 27/12* (2006.01)
*H01L 29/417* (2006.01)

(52) U.S. Cl.
CPC .......... *H01L 27/1259* (2013.01); *G09G 3/3611* (2013.01); *H01L 27/1255* (2013.01); *H01L 29/41733* (2013.01)

(58) Field of Classification Search
CPC ... G09G 2300/0439–2300/0465; G09G 3/007; G09G 3/3611–3/696; G09G 2310/0264–2310/0289
USPC .................................... 345/87–104, 211–213
See application file for complete search history.

(56) References Cited

U.S. PATENT DOCUMENTS

| | | | |
|---|---|---|---|
| 2003/0222311 A1* | 12/2003 | Kim ............................... | 257/347 |
| 2004/0125262 A1* | 7/2004 | Cho et al. ....................... | 349/43 |
| 2005/0083292 A1* | 4/2005 | Moon et al. ................... | 345/100 |
| 2005/0263762 A1* | 12/2005 | Kim ............................... | 257/66 |
| 2005/0275609 A1* | 12/2005 | Lee et al. ........................ | 345/82 |
| 2006/0145999 A1* | 7/2006 | Cho et al. ....................... | 345/100 |
| 2007/0164289 A1* | 7/2007 | Jung .............................. | 257/72 |
| 2009/0115023 A1* | 5/2009 | Kim ............................... | 257/532 |
| 2010/0051957 A1* | 3/2010 | Kim et al. ...................... | 257/72 |
| 2010/0156862 A1* | 6/2010 | Kim et al. ...................... | 345/206 |
| 2011/0007049 A1* | 1/2011 | Kikuchi et al. ............... | 345/208 |
| 2011/0012880 A1* | 1/2011 | Tanaka et al. ................. | 345/211 |
| 2011/0057194 A1* | 3/2011 | Kim et al. ....................... | 257/59 |

* cited by examiner

*Primary Examiner* — Sanghyuk Park
(74) *Attorney, Agent, or Firm* — INNOVATION COUNSEL LLP

(57) ABSTRACT

A gate drive circuit includes plural stages connected together one after each other. Each of the plural stages includes a circuit transistor, a capacitor part, a first connection part and a second connection part. The circuit transistor outputs the gate signal through a source electrode in response to a control signal applied through a gate electrode. The capacitor part includes a first electrode, a second electrode formed on the first electrode, and a third electrode formed on the second electrode. The first connection part electrically connects the gate electrode of the circuit transistor and the second electrode of the capacitor part. The second connection part electrically connects the source electrode of the circuit transistor and the first electrode of the capacitor part. Thus, an integrated size of a gate drive circuit may be decreased, and a reliability of a gate drive circuit may be enhanced.

20 Claims, 11 Drawing Sheets

GATE DRIVE CIRCUIT HAVING REDUCED SIZE, DISPLAY SUBSTRATE HAVING THE SAME, AND METHOD OF MANUFACTURING THE DISPLAY SUBSTRATE

PRIORITY STATEMENT

This application claims priority under 35 U.S.C. §119 to Korean Patent Application No. 10-2010-0135278, filed on Dec. 27, 2010 in the Korean Intellectual Property Office (KIPO), the contents of which are herein incorporated by reference in their entirety.

BACKGROUND

1. Field of the Invention

Example embodiments of the claimed subject matter relate to a gate drive circuit, a display substrate having the gate drive circuit, and a method of manufacturing the display substrate. More particularly, example embodiments of the relate to a gate drive circuit used to a liquid crystal display ("LCD") device, a display substrate having the gate drive circuit, and a method of manufacturing the display substrate.

2. Description of the Related Art

In general, an LCD device includes an LCD panel displaying images using light transmittance of a liquid crystal and a backlight assembly disposed below the LCD panel to provide the LCD panel with lights.

The LCD device includes a display panel in which a plurality of pixel parts connected to gate lines and data lines crossing the gate lines are formed, a gate drive circuit outputting a gate signal to the gate line and a data drive circuit outputting a data signal to the data line. The gate drive circuit and the data drive circuit may be formed as a chip type to be formed on the display panel.

Recently, in order to decrease a total size of a gate drive circuit and enhance a productivity of the gate drive circuit, the gate drive circuit has been integrated on the display substrate as an amorphous silicon gate ("ASG") type.

When the ASG technology is utilized with a small-sized LCD panel, manufacturing costs may be decreased. However, when the ASG technology is utilized with a large-sized LCD panel, a size of the gate drive circuit formed on the glass substrate may be increased.

When a formation size of the gate drive circuit is increased, a size of a glass substrate used to manufacture the large-sized LCD panel may also increase. Thus, manufacturing costs of the LCD panel may be increased. However, if a width of the gate drive circuit is increased when the size of the glass substrate is fixed, the number of manufacturable LCD panels, e.g., the number of LCD panels of sufficient quantity for sale to consumers, is decreased, so that manufacturing costs of the LCD panel may be increased.

Particularly, a capacitor formed between an input terminal and an output terminal of an output transistor of the gate drive circuit occupies a large area, so that it is required to decrease a size of the capacitor.

SUMMARY

Example embodiments of the claimed subject matter provide a gate drive circuit capable of enhancing a driving reliability and decreasing an integrated size thereof.

Example embodiments of the claimed subject matter also provide a display substrate having the above-mentioned gate drive circuit.

Example embodiments of the claimed subject matter also provide a method of manufacturing the above-mentioned display substrate.

According to one aspect of the claimed subject matter, a gate drive circuit includes plural stages connected together one after another. The plural stages output a plurality of gate signals. Each of the plural stages includes a circuit transistor, a capacitor part, a first connection part, and a second connection part. The circuit transistor outputs the gate signal through a source electrode in response to a control signal applied through a gate electrode. The capacitor part is formed adjacent to the circuit transistor to include a first electrode, a second electrode formed on the first electrode, and a third electrode formed on the second electrode. The first connection part electrically connects the gate electrode of the circuit transistor and the second electrode of the capacitor part. The second connection part electrically connects to the source electrode of the circuit transistor and the first electrode of the capacitor part.

In an example embodiment, the gate signal outputted through the source electrode of the circuit transistor may be outputted to the first electrode of the capacitor part through the second connection part.

In an example embodiment, the gate drive circuit may further include a first insulation layer and a second insulation layer. The first insulation layer may be formed between the first electrode of the capacitor part and the second electrode of the capacitor part. The second insulation layer may be further formed between the second electrode of the capacitor part and the third electrode of the capacitor part.

In an example embodiment, the first connection part may include a first bridge electrode electrically connecting the gate electrode and the second electrode through a first contact hole exposing the gate electrode of the circuit transistor and a second contact hole exposing the second electrode of the capacitor part.

In an example embodiment, the second connection part may include a second bridge electrode electrically connecting the source electrode and the first electrode through a third contact hole exposing the source electrode of the circuit transistor and a fourth contact hole exposing the first electrode of the capacitor part.

In an example embodiment, the second bridge electrode may be extended from the third electrode.

In an example embodiment, the first electrode of the capacitor part and the gate electrode of the circuit transistor may be formed from a same material.

In an example embodiment, the second electrode of the capacitor part and the source electrode of the circuit transistor may be formed from a same material.

According to another aspect of the claimed subject matter, a display substrate includes a base substrate, a pixel part, a gate drive circuit, a circuit transistor, a capacitor part, a first connection part, and a second connection part. The base substrate includes a display area and a peripheral area surrounding the display area. The pixel part is formed on the display area. The pixel part includes pixel transistors connected to gate lines and data lines, and pixel electrodes connected to the pixel transistors. The gate drive circuit is formed on the peripheral area. The gate drive circuit includes plural stages connected together one after another. The plural stages output a plurality of gate signals to the gate lines. Each of the stages of the gate drive circuit includes a circuit transistor, a capacitor part, a first connection part, and a second connection part. The circuit transistor outputs the gate signal through a source electrode in response to a control signal applied through a gate electrode. The capacitor part is formed adjacent to the circuit transistor to include a first electrode, a second electrode formed on the first electrode, and a third electrode formed on the second electrode. The first connection part electrically connects the gate electrode of the circuit transistor and the second electrode of the capacitor part. The second connection part electrically connects the source electrode of the circuit transistor and the first electrode of the capacitor part.

In an example embodiment, the gate signal outputted through the source electrode of the circuit transistor may be outputted to the first electrode of the capacitor part through the second connection part.

In an example embodiment, the first electrode of the capacitor electrode part may be extended from the gate line.

In an example embodiment, the gate drive circuit may further include a first insulation layer and a second insulation layer. The first insulation layer may be formed between the first electrode of the capacitor part and the second electrode of the capacitor part. The second insulation layer may be formed between the second electrode of the capacitor part and the third electrode of the capacitor part.

In an example embodiment, the first connection part may include a first bridge electrode electrically connecting the gate electrode and the second electrode through a first contact hole exposing the gate electrode of the circuit transistor and a second contact hole exposing the second electrode of the capacitor part.

In an example embodiment, the second connection part may include a second bridge electrode electrically connecting the source electrode and the first electrode through a third contact hole exposing the source electrode of the circuit transistor and a fourth contact hole exposing the first electrode of the capacitor part.

In an example embodiment, the second bridge electrode may be extended from the third electrode of the capacitor part.

In an example embodiment, the gate line, the first electrode of the capacitor part and the gate electrode of the circuit transistor may be formed from a same material.

In an example embodiment, the data line, the second electrode of the capacitor part and the source electrode of the circuit transistor may be formed from a same material.

In an example embodiment, the pixel electrode and the third electrode of the capacitor part may be formed from a same material.

According to still another aspect of the claimed subject matter, there is provided a method of manufacturing a display substrate. In the method, a gate pattern is formed on a base substrate. The gate pattern includes a gate line and a gate electrode of a pixel transistor on a display area of a base substrate, a first electrode of a capacitor part and a gate electrode of a circuit transistor on a peripheral area surrounding the display area. Then, a first insulation layer, a semiconductor pattern, an ohmic contact layer, and a source metal layer are formed on the base substrate on which the gate pattern is formed. Then, the source metal layer is patterned to form a data line on the display area, drain/source electrodes of the pixel transistor on the display area, a second electrode of a capacitor part on the peripheral area, drain/source electrodes of the circuit transistor on the peripheral area, and an active pattern below the source pattern. Then, a second insulation layer is formed on the base substrate on which the source pattern is formed. Then, a pixel electrode, a first connection part, a second connection part, and a third electrode of the capacitor part are formed on the display area, the peripheral area, the peripheral area and the peripheral area, respectively. The pixel electrode is electrically connected to a drain electrode of the pixel transistor. The first connection part electrically connects a gate electrode of the circuit transistor and a second electrode of the capacitor part. The second connection part electrically connects a source electrode of the circuit transistor and a first electrode of the capacitor part.

In an example embodiment, in forming the first connection part and the second connection part, the first insulation layer and the second insulation layer may be partially removed to expose a drain electrode of the pixel transistor, a gate electrode and a source electrode of the circuit transistor, and the first electrode and the second electrode of the capacitor part. Then, an optically transparent and electrically conductive material may be formed on the second insulation layer. Then, the optically transparent and electrically conductive material may be patterned to form the pixel electrode, the first connection part, the second connection part, and the third electrode.

According to some example embodiments, a capacitor part is formed in a parallel structure, so that an integrated size of a gate drive circuit may be decreased. Moreover, a coupling capacitance, which is generated between an electrode of a capacitor part connected to a gate electrode of a circuit transistor outputting a gate signal and a common electrode of an opposition substrate, is removed, so that a reliability of a gate drive circuit may be enhanced.

BRIEF DESCRIPTION OF THE DRAWINGS

The above and other features will become more apparent by describing in detailed example embodiments thereof with reference to the accompanying drawings, in which.

DETAILED DESCRIPTION

Hereinafter, the claimed subject matter will be explained in detail with reference to the accompanying drawings.

Figure 1:
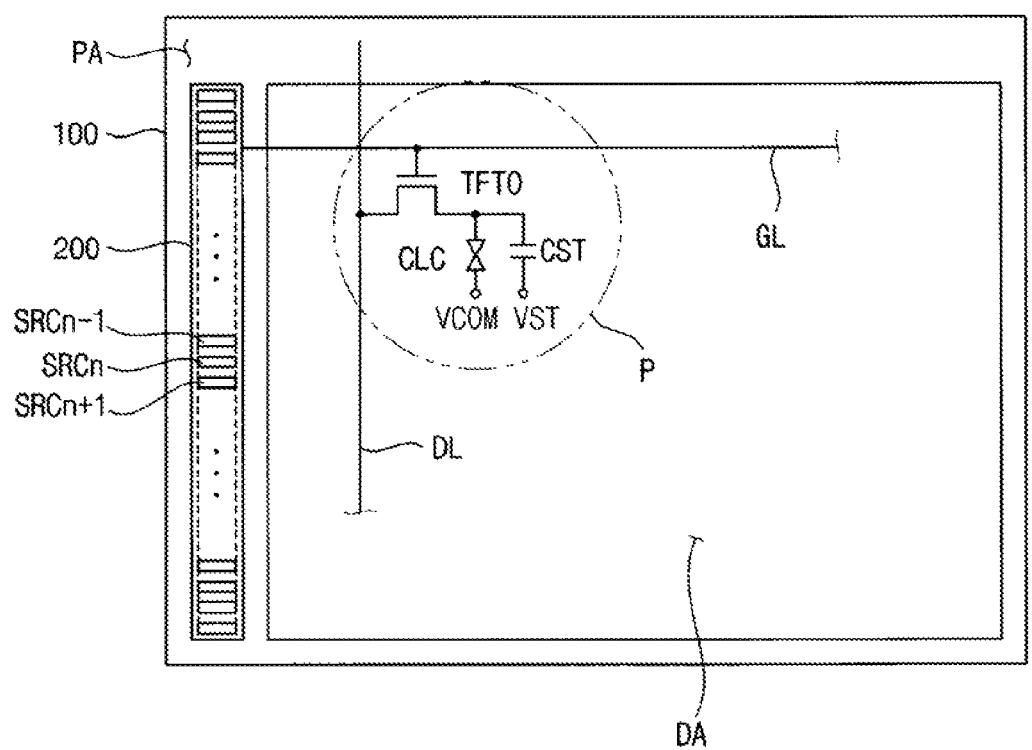
FIG. 1 is a plan view schematically showing a display substrate according to an exemplary embodiment.

FIG. 1 is a plan view schematically showing a display substrate according to an exemplary embodiment.

Referring to FIG. 1, the display substrate includes a base substrate 100 including a display area DA and a peripheral area PA surrounding the display area DA, a pixel part P formed on the display area DA and a gate drive circuit 200 formed on the peripheral area PA.

The pixel part P includes a plurality of pixel transistors TFTO electrically connected to gate lines GL and data lines DL, a plurality of liquid crystal capacitors CLC electrically connected to the pixel transistors TFT0, and a plurality of storage capacitors CST connected to the liquid crystal capacitors CLC in parallel.

The gate drive circuit 200 includes a shift register sequentially outputting gate signals of a high level to the gate lines GL. The shift register includes a plurality of stages SRCn−1, SRCn and SRCn+1 (wherein, 'n' is a natural number). The gate drive circuit 200 is integrated on the peripheral area PA corresponding to a first end portion of the gate lines GL.

In the present exemplary embodiment, a case in which the gate drive circuit 200 is integrated on an area corresponding to a first end portion of the gate lines GL is explained. Alternatively, the gate drive circuit 200 may be integrated on areas corresponding to two end portions of the gate lines GL.

Figure 2:
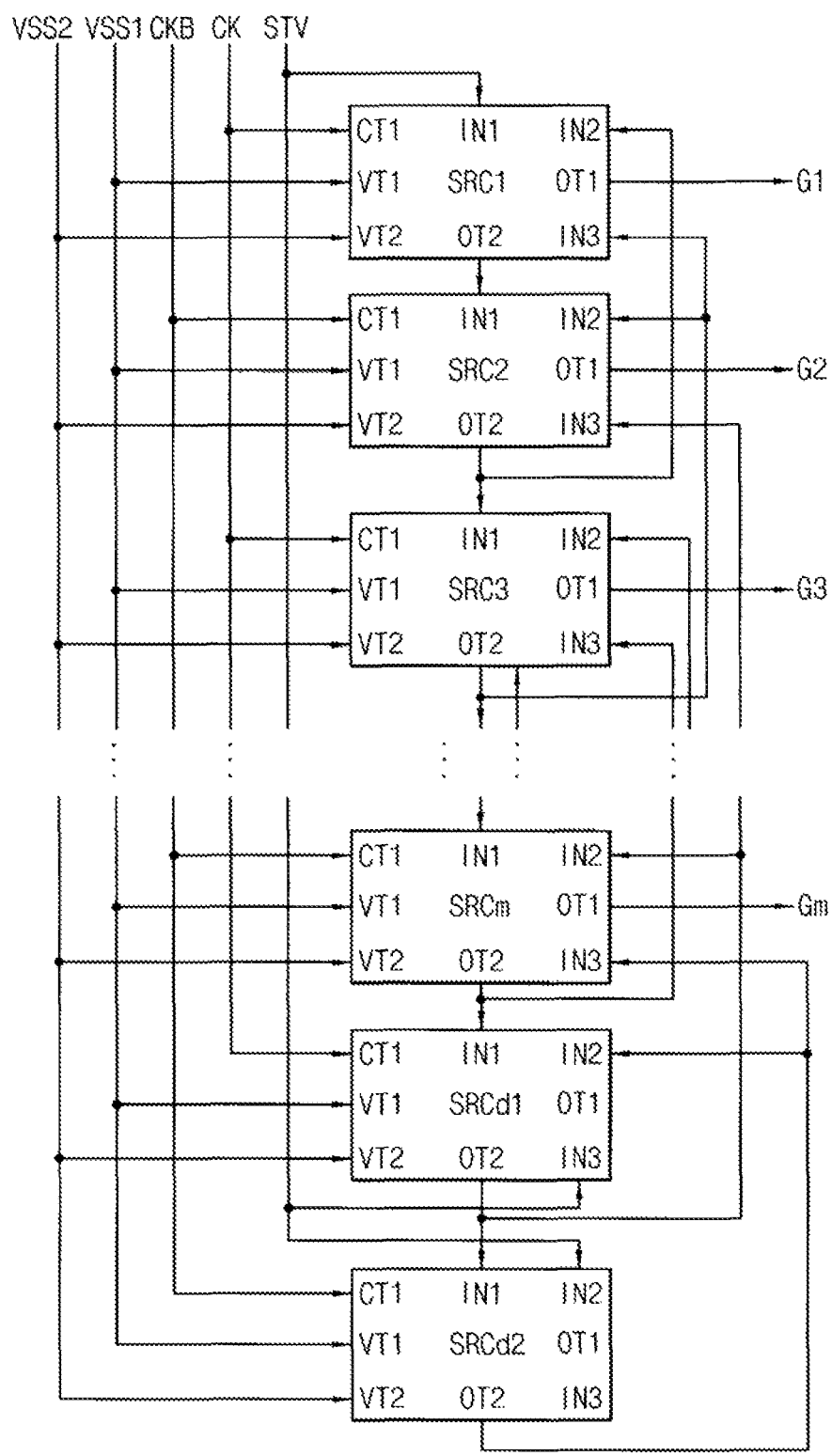
FIG. 2 is a block diagram schematically showing an example of a gate drive circuit of FIG. 1.

FIG. 2 is a block diagram schematically showing an example of a gate drive circuit of FIG. 1.

Referring to FIG. 2, the gate drive circuit 200 includes a shift register including first to m-th stages SRC1 to SRCm, a first dummy stage SRCd1 and a second dummy stage SRCd2 that are connected one after another to each other.

The first to m-th stages SRC1 to SRCm are respectively connected to m gate lines GL to sequentially output m gate signals to the gate lines GL. The first dummy stage SRCd1 controls an operation of the (m−1)-th and m-th stages SRC1, and the second dummy stage SRCd2 controls an operation of the m-th and first stages SRCm and SRCd1. The first and second dummy stages SRCd1 and SRCd2 are not electrically connected to the gate lines GL.

Each of the stages includes a clock terminal CT1, a first input terminal IN1, a second input terminal IN2, a third input terminal IN3, a first power terminal VT1, a second power terminal VT2, a first output terminal OT1 and a second output terminal OT2.

The first clock terminal CT1 receives a clock signal CK or an inverse clock signal CKB. For example, the first clock terminals CT1 of odd-numbered stages SRCd1, SRC3 to SRCd1 receive the clock signal CK, and the first clock terminals CT1 of even-numbered stages SRC2, SRC4 to SRCd2 receive the inverse clock signal CKB. The clock signal CK and the inverse clock signal CKB may be a high voltage VDD and a first low voltage VSS1.

The first input terminal IN1 receives a vertical start signal STV or an (n−1)-th carry signal CRn−1. For example, the first input terminal IN1 of the first stage SRC1 receives the vertical start signal STV, and the first input terminals IN1 of the second to second dummy stages SRC2 to SRCd2 receive the (n−1)-th carry signal CRn−1.

The second input terminal IN2 receives an (n+1)-th carry signal CRn+1 or the vertical start signal STV. The second input terminal IN2 of the first to first dummy stages SRC1 to SRCd1 receive the (n+1)-th carry signal CRn+1, and the second input terminal IN2 of the second dummy stage SRCd2 receives the vertical start signal STV. The vertical start signal STV received at the second input terminal IN2 of the second dummy stage SRCd2 may be a vertical start signal corresponding to a following frame.

The third input terminal IN3 receives an (n+2)-th carry signal CRn+2 or the vertical start signal STV. The third input terminal IN3 of the first to m-th stages SRC1 to SRCm receive the (n+1)-th carry signal CRn+2, and the third input terminal IN3 of the first dummy stage SRCd1 receives the vertical start signal STV.

The first voltage terminal VT1 receives the first low voltage VSS1. The first low voltage VSS1 has a first low level. The first low level corresponds to a discharging level of the gate signal. For example, the first low level may be about −6 V.

The second voltage terminal VT2 receives a second low voltage VSS2 having a second low level lower than the first low level VSS1. The second low level corresponds to a discharging level of a first node (hereinafter, Q node) included in the stage. For example, the second low level is about −10 V.

The first output terminal OT1 electrically is connected to a corresponding gate line to output the gate signal. The first output terminals OT1 of the first to m-th stages SRC1 to SRCm output first to m-th gate signals. The first output terminals OT1 of the first and second dummy stages SRCd1 and SRCd2 do not output gate signals.

The second output terminal OT2 outputs the carry signal. The second output terminal OT2 is electrically connected to a first input terminal IN1 of an (n+1)-th stage SRCn+1. Moreover, the second output terminal OT2 is electrically connected to a second input terminal IN2 of an (n−1)-th stage SRCn−1 and a third input terminal IN3 of an (n−2)-th stage SRCn−2.

Figure 3:
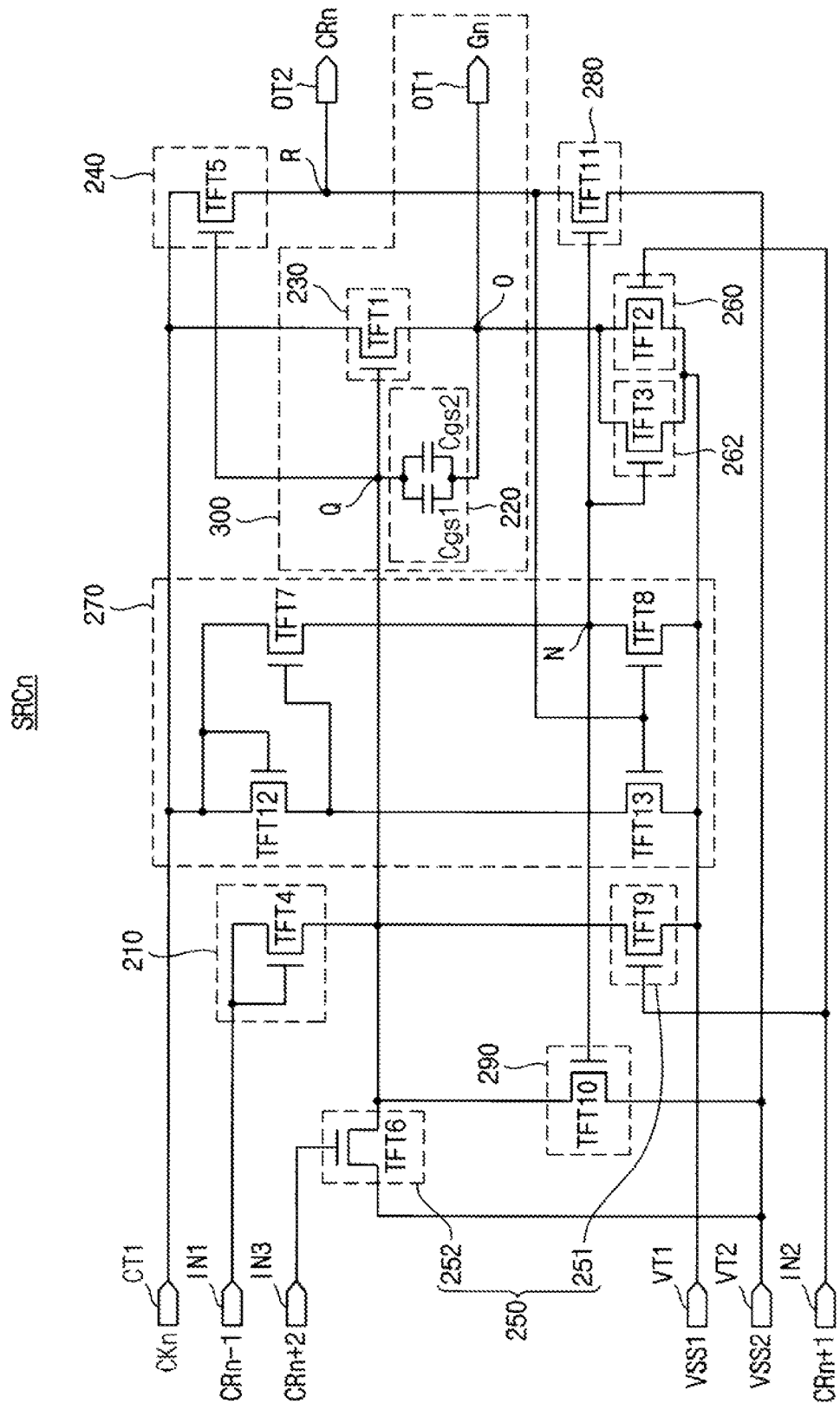
FIG. 3 is an equivalent circuit diagram schematically showing a stage of FIG. 2.

FIG. 3 is an equivalent circuit diagram schematically showing a stage of FIG. 2.

Referring to FIGS. 2 and 3, an n-th stage SRCn includes a buffer part 210, a capacitor part 220, a pull-up part 230, a carry part 240, a discharging part 250, a pull-down part 260, a switching part 270, a first maintaining part 280, a second maintaining part 290 and a third maintaining part 262.

The buffer part 210 delivers the (n−1)-th carry signal CRn−1 to the pull-up part 230. The buffer part 210 may include a fourth transistor TFT4.

The capacitor part 220 is charged in response to the (n−1)-th carry signal CRn−1 provided from the buffer part 210. The capacitor part 220 is formed between a gate electrode and a source electrode of the pull-up part 230.

The capacitor part 220 includes a first capacitor Cgs1 and a second capacitor Cgs2 connected to the first capacitor Cgs1 in parallel. A first terminal of the first capacitor Cgs1 and a first terminal of the second capacitor Cgs2 are commonly connected to the Q node Q, and a second terminal of the first capacitor Cgs1 and a second terminal of the second capacitor Cgs2 are commonly connected to an output node O of the gate signal.

When a high voltage VDD of an (n−1)-th carry signal CRn−1 is received by the buffer part 210, the capacitor part 220 charges a first voltage V1 corresponding to the high voltage VDD. The first capacitor Cgs1 has a first capacitance formed between a first electrode and a second electrode formed on the first electrode and a second capacitance formed between the second electrode and a third electrode formed on the second electrode.

The first capacitor Cgs1 and the second capacitor Cgs2 are connected to each other in parallel, so that a size of the capacitor part 220 may be decreased. For example, when the capacitor part 220 includes a single capacitor, the capacitor part 220 may occupy an area of about 20% of a total area of the gate drive circuit 200.

When the capacitor part 220 includes the first and second capacitors Cgs1 and Cgs2 connected in parallel, a size of the capacitor part 220 may be decreased to about 6.25% of a total area of the gate drive circuit 200. Thus, an integrated size of a gate drive circuit 200 may be decreased to about 15% of a total area.

The pull-up part 230 outputs the gate signal. The first pull-up part 230 may include a first transistor TFT1. The first transistor TFT1 includes a gate electrode connected to the Q node, a drain electrode connected to the first clock terminal CT1 and a source electrode connected to the output node O. The output node O is connected to the first output terminal OT1.

The Q node Q connected to the gate electrode is electrically connected to a second electrode of the capacitor part 220, so that a coupling capacitor, which is generated between the second electrode of the capacitor part 220 and a common electrode of an opposite substrate, does not affect the Q node Q. In the present exemplary embodiment, the pull-up part 230, the capacitor part 220 and the first output terminal OT1 are defined as an output part 300. A detailed description of the output part 300 will be described later.

In a state that the first voltage V1 charged to the capacitor part 220 is applied to a gate electrode of the pull-up part 230, when a high voltage VDD of the clock signal CK is received by the first clock terminal CT1, the pull-up part 230 is bootstrapped. At this time, the Q node Q connected to a control electrode of the pull-up part 230 is boosted in a boosting voltage VBT at the first voltage V1. That is, the Q node Q has the first voltage V1 at an (n−1)-th interval Tn−1, and has the boosting voltage VBT at an n-th interval Tn.

During the n-th interval Tn during which the boosting voltage VBT is applied to a gate electrode of the pull-up part 230, the pull-up part 230 outputs a high voltage VDD of the clock signal CK as a high voltage VDD of an n-th gate signal Gn. The n-th gate signal Gn is outputted through the first output terminal OT1 connected to the output node O.

The pull-down part 260 pulls down a voltage of the output node O into the first low voltage VSS1 applied to the first voltage terminal VT1 when an (n+1)-th gate signal Gn+1 is received by the second input terminal IN2. The pull-down part 260 may include a second transistor TFT2.

The carry part 240 outputs a high voltage VDD of the clock signal CK received at the first clock terminal CT1 as an n-th carry signal CRn when a high voltage is applied to the Q node Q. The n-th carry signal CRn is outputted through the second output terminal OT2 connected to the R node R. The carry part 240 may include a fifth transistor TFT5.

The first maintaining part 280 maintains a voltage of the R node R as the second low voltage VSS2 in response to a signal of the N node N during a remaining interval of the frame. The first maintaining part 280 may include an eleventh transistor TFT11.

The switching part 270 applies a signal having a phase identical to the clock signal CK received at the first clock terminal CT1 to the N node N during an interval except an output interval of the n-th carry signal CRn. The switching part 270 may include a twelfth transistor TFT12, a seventh transistor TFT7, a thirteenth transistor TFT13, and an eighth transistor TFT8.

The discharging part 250 discharges a high voltage of the Q node Q as a second low voltage VSS2 having a level lower than the first low voltage VSS1 in response to at least one carry signal of following stages. The discharging part 250 may include a first discharging part 251 including a ninth transistor TFT9 and a second discharging part 252 including a sixth transistor TFT6.

The first discharging part 251 discharges a voltage of the Q node Q as the first low voltage VSS1 applied to the first voltage terminal VT1 when the (n+1)-th carry signal Gn+1 is received by the second input terminal IN2.

The second discharging part 252 discharges a voltage of the Q node Q as the second low voltage VSS2 applied to the second voltage terminal VT2 when the (n+2)-th carry signal Gn+2 is received by the third input terminal IN3.

The second maintaining part 290 maintains a voltage of the Q node Q as the second low voltage VSS2 in response to a signal of the N node N during a remaining interval of the frame. The second maintaining part 290 may include a tenth transistor TFT10.

The third maintaining part 262 maintains a voltage of the output node O as the first low voltage VSS1 applied to the first voltage terminal VT1 in response to a signal of the N node N during a remaining interval of the frame. The third maintaining part 262 may include a third transistor TFT3.

The gate drive circuit and each stage shown in FIGS. 2 and 3 are an example embodiment. The present exemplary embodiment may be applicable to a gate drive circuit including the pull-up part 230 and the capacitor part 220.

Figure 4:
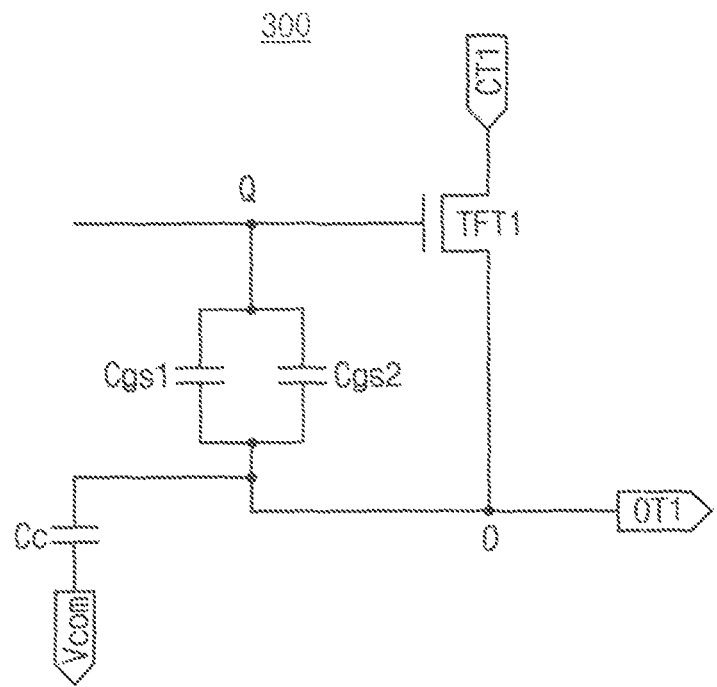
FIG. 4 is a concept diagram schematically showing an output part of FIG. 3.
Figure 5:
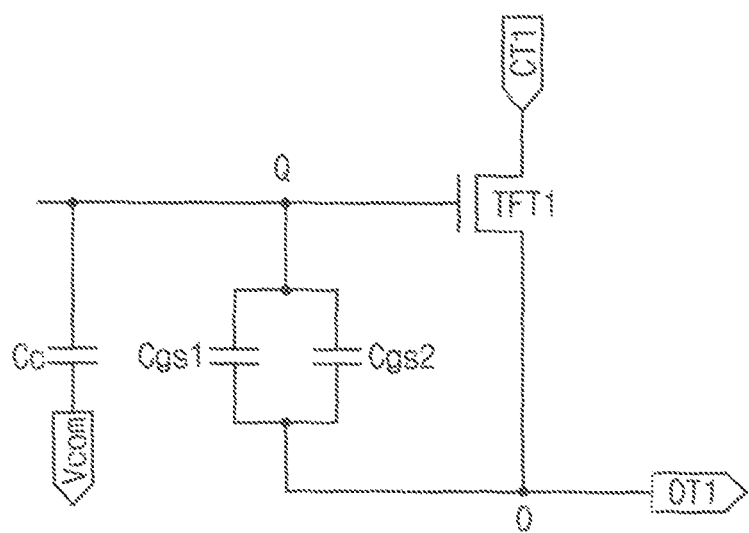
FIG. 5 is a concept diagram schematically showing an output part of a conventional gate drive circuit.

FIG. 4 is a concept diagram schematically showing an output part of FIG. 3. FIG. 5 is a concept diagram schematically showing an output part of a conventional gate drive circuit.

A common voltage Vcom shown in FIGS. 4 and 5 is applied to a common electrode (not shown) formed on an opposition substrate opposite the display substrate. In a structure in which the first capacitor Cgs1 and the second capacitor Cgs2 of the capacitor part 220 are connected to each other in parallel, the third electrode of the capacitor part 220 is opposite the common electrode. Thus, a coupling capacitor Cc is generated between the third electrode and the common electrode.

Therefore, as shown in FIG. 5, the Q node Q connected to the third electrode may be affected by the coupling capacitor Cc. Since the Q node Q is connected to a gate electrode of the first transistor TFT1, the gate signal may be unstable.

In the present exemplary embodiment, a gate electrode of the first transistor TFT1 is not connected to a third electrode of the capacitor part 220 and is electrically connected to a second electrode, so that the Q node Q is not opposite to the common electrode.

Therefore, as shown in FIG. 4, the coupling capacitor generated between the third electrode and the common electrode does not affect the Q node Q, so that the first transistor TFT1 may output a stable gate signal.

Figure 6:
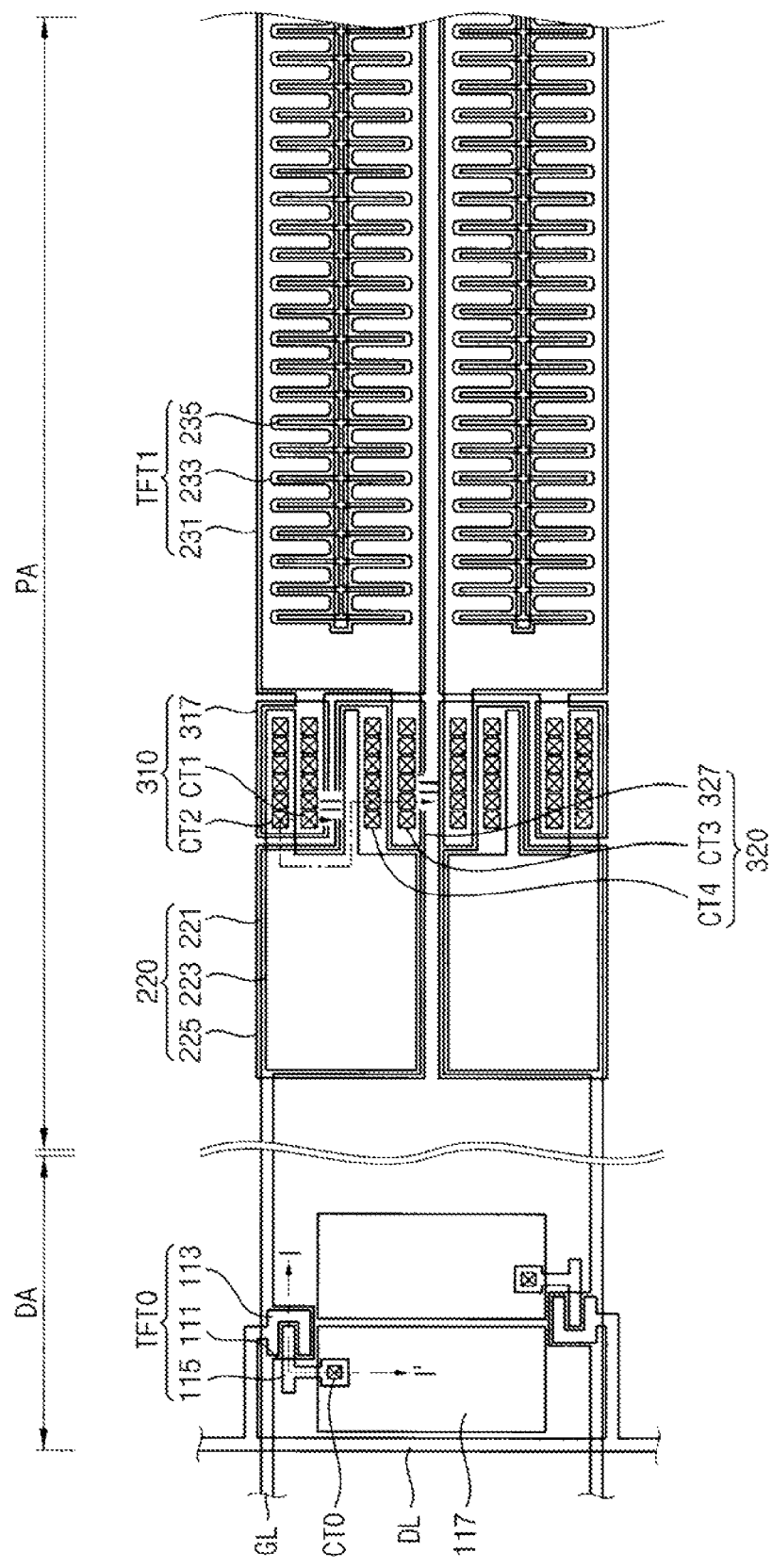
FIG. 6 is a layout diagram schematically showing a pixel part and a gate drive circuit that are formed on a display substrate of FIG. 1.
Figure 7:
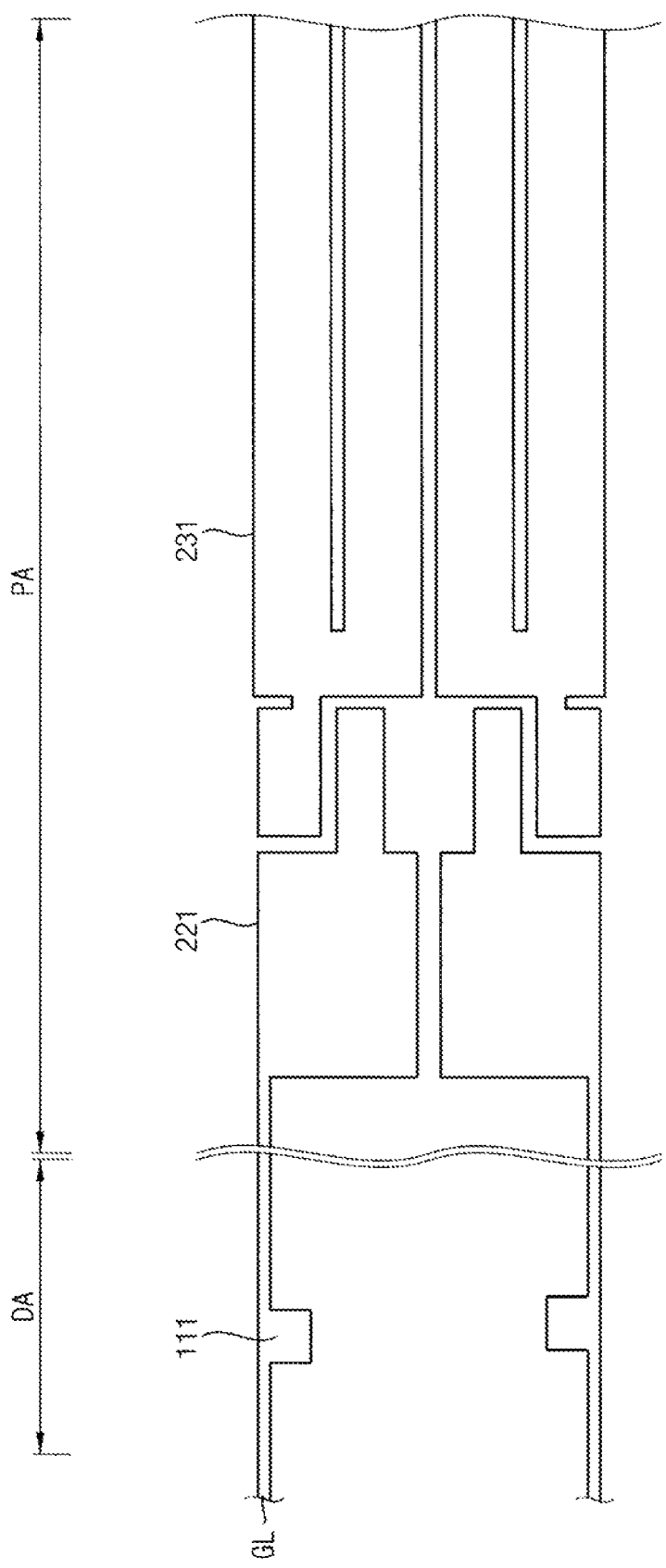
FIG. 7 is a layout diagram schematically showing a gate pattern of FIG. 6.
Figure 8:
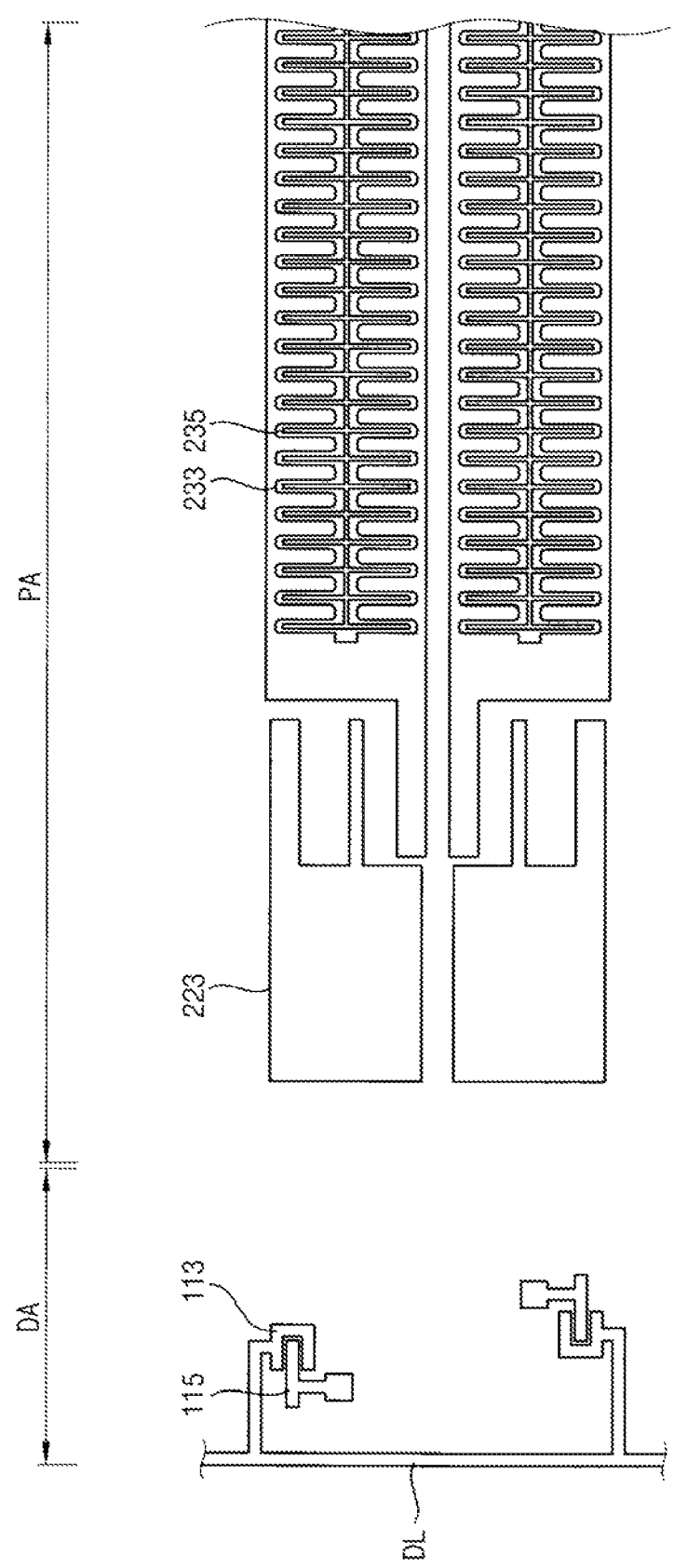
FIG. 8 is a layout diagram schematically showing a source pattern of FIG. 6.
Figure 9:
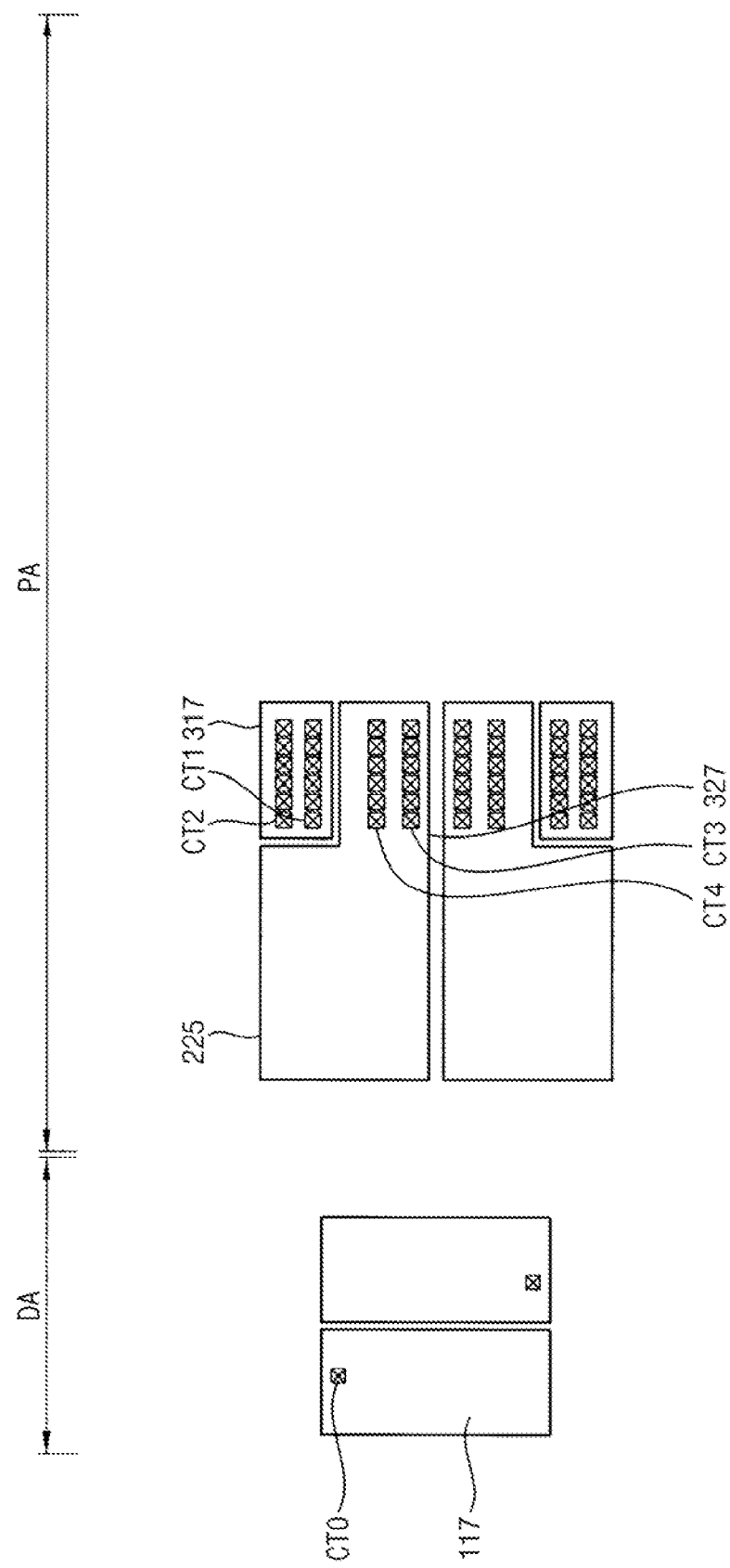
FIG. 9 is a layout diagram schematically showing a transparent conductive layer of FIG. 6.
Figure 10:
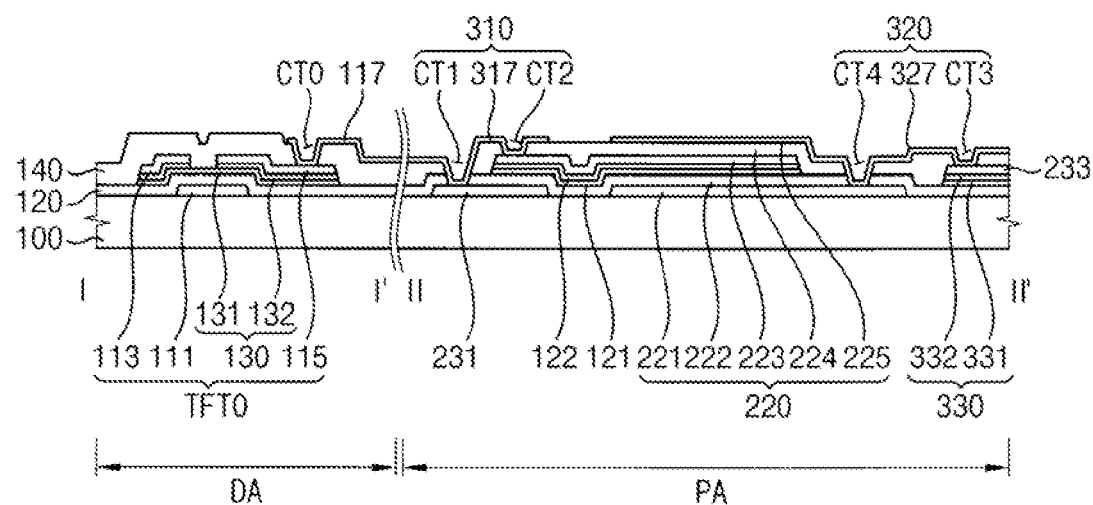
FIG. 10 is a cross-sectional view taken along a line I-I' and a line II-IF of FIG. 6.

FIG. 6 is a layout diagram schematically showing a pixel part and a gate drive circuit that are formed on a display substrate of FIG. 1. FIG. 7 is a layout diagram schematically showing a gate pattern of FIG. 6. FIG. 8 is a layout diagram schematically showing a source pattern of FIG. 6. FIG. 9 is a layout diagram schematically showing a transparent conductive layer of FIG. 6. FIG. 10 is a cross-sectional view taken along a line I-I' and a line II-II' of FIG. 6.

Referring to FIGS. 6 to 10, the pixel part P formed on the display area DA of the base substrate 100 includes a gate line GL, a data line DL, a pixel transistor TFT10 electrically connected to the gate line GL and the data line DL, a passivation layer 140 and a pixel electrode 117.

The pixel transistor TFT10 includes a gate electrode 111, a gate insulation layer 120, a channel portion 130, a source electrode 113 and a drain electrode 115.

The gate electrode 111 is extended from the gate line GL to include a first metal pattern identical to the gate line GL.

The gate insulation layer 120 is formed on the base substrate 100 to cover the first metal pattern. The gate insulation layer 120 may include a silicon nitride (SiNx).

The channel portion 130 is formed on the gate insulation layer in correspondence with the gate electrode 111. The channel portion 130 includes an activation layer 131 and an ohmic contact layer 132.

For example, the activation layer 131 may include amorphous silicon (a-Si), and the ohmic contact layer 332 may include amorphous silicon (n+a-Si) doped with n type dopants at a high concentration. The ohmic contact layer 132 is formed on an area overlapped with the source and drain electrodes 113 and 115.

The source electrode 113 is extended from the data line DL to include a second metal pattern identical to the data line DL.

The drain electrode 115 also includes the second metal pattern to be electrically connected to the pixel electrode 117. The drain electrode 115 is spaced part from the source electrode 113 to be formed on the gate insulation layer 120 which is opposite to the source electrode 113 with respect to a center portion of the gate electrode 111.

The passivation layer 140 is formed on the gate insulation layer 120 to cover the second metal pattern. A contact hole CT0 for partially exposing the drain electrode 115 is formed through the passivation layer 140.

The pixel electrode 117 is formed on the passivation layer 140 of the pixel part P to receive a pixel voltage from the drain electrode 115 through the contact hole CT0. That is, the pixel electrode 117 is a first electrode of the liquid crystal capacitor CLC. The pixel electrode 117 may include an optically transparent and electrically conductive material which transmits lights. The optically transparent and electrically conductive material may include an indium tin oxide (ITO) or an indium zinc oxide (IZO).

Although not shown in FIGS. 6 to 10, the display substrate may further include a storage common line.

The storage common line includes the first metal pattern identical to the gate line GL to be simultaneously formed when the gate line GL is formed. The storage common line is a common electrode of a storage capacitor which maintains a pixel voltage charged to the liquid crystal capacitor CLC for a predetermined time.

Each stage of a gate drive circuit 200 formed on the peripheral area PA of the base substrate 100 includes a first transistor TFT1, a capacitor part 220, a first connection part 310 and a second connection part 320.

The first transistor TFT1 includes a gate electrode 231, a first insulation layer 222, a channel portion 330, a source electrode 233 and a drain electrode 235. As described in FIG. 3, the gate electrode 231 of the first transistor TFT1 is connected to the Q node Q to receive a high voltage VDD of the clock signal CK. The first transistor TFT1 outputs the gate signal Gn through the source electrode 233 in response to a high voltage VDD of the clock signal CK.

The gate electrode 231 of the first transistor TFT1 includes the first metal pattern to be simultaneously formed when the gate line GL is formed.

The first insulation layer 222 is formed on the base substrate 100 to cover the gate electrode 231. The first insulation layer 222 may include a silicon nitride (SiNx) layer to be simultaneously formed when the gate insulation layer 120 of the pixel transistor TFT0 is formed.

The first insulation layer 222 partially exposes the gate electrode 231.

The source electrode 233 and the drain electrode 235 of the first transistor TFT1 includes the second metal pattern to be simultaneously formed when the data line DL is formed.

The channel portion 330 is formed below the source electrode 233 and the drain electrode 235 of the first transistor TFT1. The channel portion 330 includes an activation layer 331 and an ohmic contact layer 332.

For example, the activation layer 331 may include amorphous silicon (a-Si) to be simultaneously formed when the activation layer 131 of the pixel transistor TFT0 is formed. The ohmic contact layer 332 may include amorphous silicon (n+a-Si) doped with n type dopants at a high concentration to be simultaneously formed when the ohmic contact layer 132 of the pixel transistor TFT0 is formed.

The capacitor part 220 is formed adjacent to the first transistor TFT1. The capacitor part 220 is formed between the first transistor TFT1 and the pixel part P.

The capacitor part 220 includes a first electrode 221, a second electrode 223 and a third electrode 225. The capacitor part 220 may further include a first insulation layer 222 and a second insulation layer 224.

The first electrode 221 is formed on the base substrate 100, and is extended from the gate line GL. The first electrode 221 includes the first metal pattern to be simultaneously formed when the gate line GL is formed on the base substrate 100.

Referring to FIG. 7, the gate line GL of the display area DA, the gate electrode 111 of the pixel transistor TFT0, the gate electrode 231 of the first transistor TT1 of the peripheral area PA and the first electrode 221 of the capacitor part 220 may include the first metal pattern to be simultaneously formed.

The first insulation layer 222 is formed on the base substrate 100 to cover the first electrode 221. The first insulation layer 222 may include a silicon nitride (SiNx) to be simultaneously formed when the gate insulation layer 120 is formed.

The first insulation layer 222 partially exposes the first electrode 221.

The second electrode 223 is formed on the base substrate 100 on which the first insulation layer 222 is formed. The second electrode 223 may include the second metal pattern to be simultaneously formed when the data line DL is formed.

Referring to FIG. 8, the data line DL, the source electrode 112 and the drain electrode 115 of the pixel transistor TFTO, the source electrode 233 and the drain electrode 235 of the first transistor TT1, and the second electrode 223 of the capacitor part 220 may include the second metal pattern to be simultaneously formed.

The first electrode 221 and the second electrode 223 may form the first capacitor Cgs1, so that a first capacitance may be formed between the first electrode 221 and the second electrode 223.

First and second active patterns 121 and 122 may be simultaneously formed below the second electrode 223. The first and second active patterns 121 and 122 may include a same material as the active layer 131 and the ohmic contact layer 132 of the pixel transistor TFT0. The first and second active patterns 122 and 122 may be formed when the display substrate is formed through a four-mask process.

The second insulation layer 224 is formed on the base substrate 100 on which the second electrode 223 is formed. The second insulation layer 224 may include a same material as the passivation layer 140 to be simultaneously formed when the passivation layer 140 is formed. The second insulation layer 224 is formed on the first transistor TFT1.

A first contact hole CT1 which partially exposes a gate electrode 231 of the first transistor TFT1 and a second contact hole CT2 which partially exposes the second electrode 223 to be adjacent to the first contact hole CT1 are formed through the second insulation layer 224. Moreover, a third contact hole CT3 which partially exposes a source electrode 233 of the first transistor TFT1 and a fourth contact hole CT4 which partially exposes the first electrode 221 to be adjacent to the third contact hole CT3 are formed through the second insulation layer 224.

The third electrode 225 is formed on the base substrate 100 on which the second insulation layer 224 is formed. The third electrode 225 may include a same material as the pixel electrode 117 to be simultaneously formed when the pixel electrode 117 is formed.

The third electrode 225 may include an optically transparent and electrically conductive material which transmits lights. The optically transparent and electrically conductive material may include an indium tin oxide (ITO) or an indium zinc oxide (IZO).

The second electrode 223 and the third electrode 225 form the second capacitor Cgs2, so that a second capacitance is formed between the second electrode 223 and the third electrode 225.

The first connection part 310 electrically connects the gate electrode 231 and the second electrode 223. The first contact part 310 includes a first bridge electrode 317 which connects the gate electrode 231 and the second electrode 223 through the first contact CT1 and the second contact hole CT2.

A signal applied to the gate electrode 231 of the first transistor TFT1 is applied to the second electrode 223 of the capacitor part 220 through the first bridge electrode 317. A signal applied to the gate electrode 231 of the first transistor TFT1 is a control signal which controls an output of the gate signal.

The first electrode 221 is formed on a lower portion of the second electrode 223, and the third electrode 225 is formed on an upper portion of the second electrode 223. The second electrode 223 may be protected from an external electric field.

Since the second electrode 223 is not opposite to a common electrode (not shown) formed on the opposition substrate, a coupling capacitance is not generated between the second electrode 223 and the common electrode. Thus, the coupling capacitance does not affect the gate electrode 231 of the first transistor TFT1, so that a gate drive circuit may be stably driven.

The first bridge electrode 317 may include a same material as the pixel electrode 117 to be simultaneously formed when the pixel electrode 117 is formed.

The second connection part 320 electrically connects the source electrode 233 and the first electrode 221. The second connection part 320 includes a second bridge electrode 327 connecting the source electrode 233 and the first electrode 221 through the third contact hole CT3 and the fourth contact hole CT4.

A signal applied to the source electrode 233 of the first transistor TFT1 is applied to the first electrode 221 of the capacitor part 220 through the second bridge electrode 327. A signal applied to the source electrode 233 of the first transistor TFT1 is the gate signal which controls an output of the gate signal.

The gate signal outputted from the source electrode 233 is applied to the first electrode 221. The first electrode 221 is extended from the gate line GL of the display area DA. Thus, the gate signal is delivered to the gate line GL through the first electrode 221 of the capacitor part 220.

The second bridge electrode 327 may include a same material as the pixel electrode 117 to be simultaneously formed when the pixel electrode 117 is formed. The second bridge electrode 327 may be extended from the third electrode 225.

Referring to FIG. 9, the pixel electrode 117, the first bridge electrode 317, the second bridge electrode 327 and the third electrode 225 of the capacitor part 220 may include an optically transparent and electrically conductive material which transmits lights. The optically transparent and electrically conductive material may include an indium tin oxide (ITO) or an indium zinc oxide (IZO). The pixel electrode 117 is formed on the display area DA. The first bridge electrode 317, the second bridge electrode 327 and the third electrode 225 are formed on the peripheral area PA. The pixel electrode 117, the first bridge electrode 317, the second bridge electrode 327 and the third electrode 225 of the capacitor part 220 may be simultaneously formed.

According to the present exemplary embodiment, the capacitor part 220 is formed in a parallel structure, so that an integrated size of the gate drive circuit 200 may be decreased. Moreover, the gate electrode 231 and the second electrode 223 are electrically connected to each other through the first connection part 310, and the source electrode 233 and the first electrode 221 are connected to each other through the second connection part 320.

Thus, the coupling capacitance does not affect the gate electrode 231 of the first transistor TFT1, so that a reliability of a gate drive circuit 200 may be enhanced.

FIGS. 11A to 11E are cross-sectional views explaining a manufacturing method of a display substrate of FIG. 1.

Figure 11A:
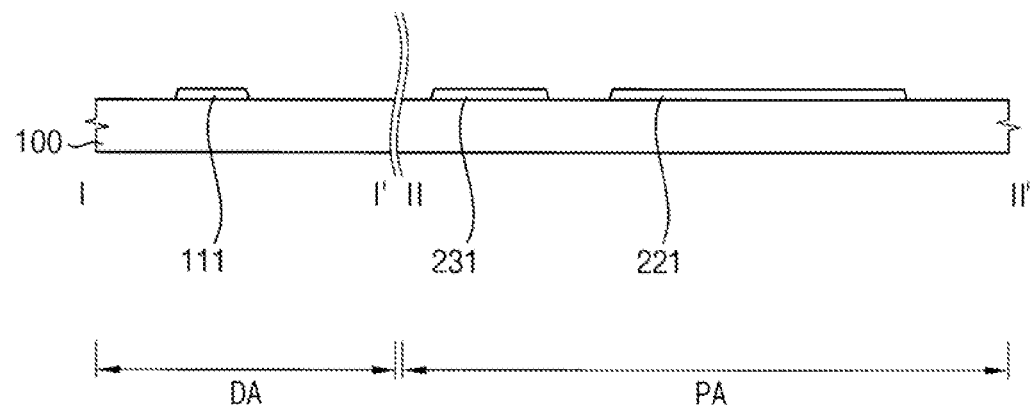
FIGS. 11A to 11E are cross-sectional views explaining a manufacturing method of a display substrate of FIG. 1.

Referring to FIG. 11A, a gate metal layer is formed on a base substrate 100, and then the gate metal layer is patterned to form a gate pattern. The gate pattern includes a gate line GL and a gate electrode 111 of a pixel transistor that are formed on a display area DA, and a gate electrode 231 of the first transistor TFT1 and a first electrode 221 of a capacitor 220 that are formed on a peripheral area PA.

For example, the gate metal layer is formed on the base substrate 100 through a metal deposition method such as a sputtering method. The gate metal layer may include a metal such as molybdenum (Mo), titanium (Ti), copper (Cu), aluminum (Al), chromium (Cr), etc., or a metal alloy thereof. The gate metal layer may be formed in a single layer or a double layer. Then, the gate metal layer is patterned through a photolithograph process and an etching process by using a first mask to form the gate pattern.

Figure 11B:
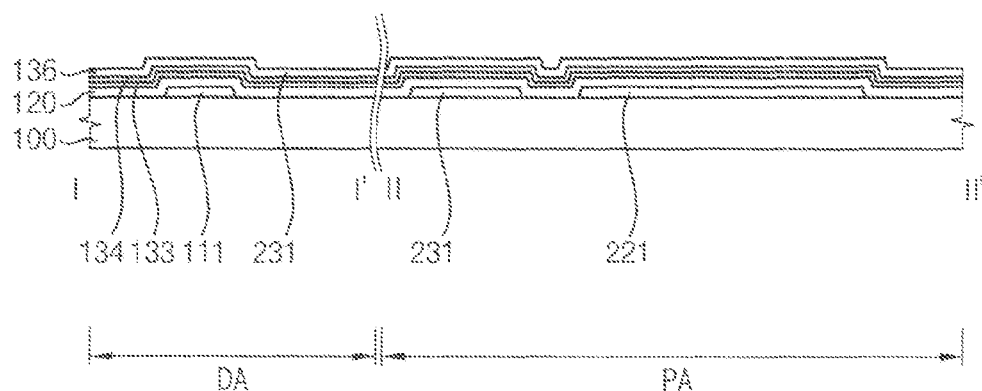

Referring to FIG. 11B, a gate insulation layer 120, an amorphous silicon (a-Si:H) layer 133 and an amorphous silicon (n+a-Si) layer 134 doped with n type dopants at a high concentration are sequentially formed on the base substrate 100 on which the gate pattern is formed. The gate insulation layer 120, the amorphous silicon layer 133 and the amorphous silicon may be manufactured by using, for example, a chemical vapor deposition (CVD) such as a plasma-enhanced CVD (PECVD), a physical vapor deposition such as a sputtering process, etc.

Then, a source metal layer 136 is formed on an amorphous silicon layer 134 doped with n type dopants at a high concentration. The source metal layer 136 may include a metallic material such as chromium (Cr), aluminum (Al), tantalum (Ta), molybdenum (Mo), titanium (Ti), tungsten (W), copper (Cu), silver (Ag), etc., or a metal alloy thereof. The source metal layer 136 may be deposited on the base substrate 100 through a physical vapor deposition such as a sputtering process, etc. Moreover, the source metal layer 136 may have at least two-layered structure of metallic materials having different physical characteristics to each other.

Figure 11C:
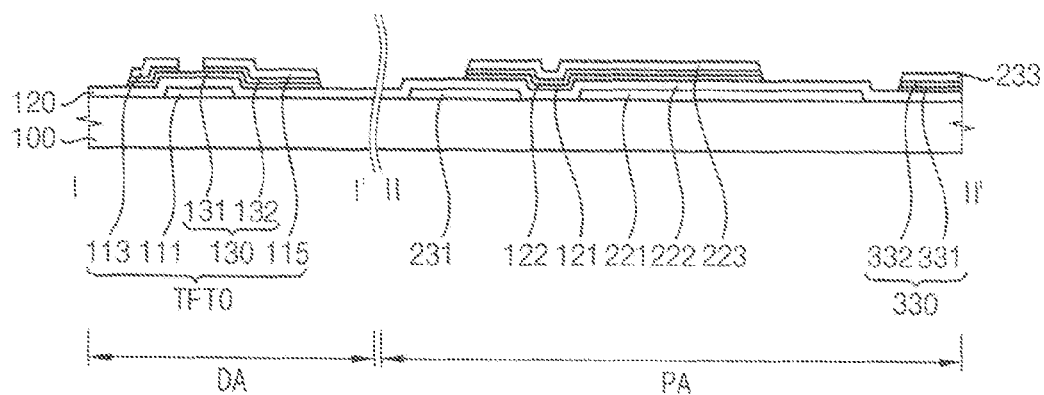

Referring to FIG. 11C, the source metal layer 136 is patterned through a second mask to form a source pattern. The source pattern includes a data line DL, a source electrode 113 of the pixel transistor TFT0, a drain electrode 115 of the pixel transistor TFT0, a source electrode 233 of the first transistor TFT1, a drain electrode 235 of the first transistor TFT1, a second electrode 223 of the capacitor part 220. The data line DL and the source and drain electrodes 113 and 115 of the pixel transistor TFT0 are formed on the display area DA. The source and drain electrodes 233 and 235 of the first transistor TFT1, and the second electrode 223 of the capacitor part 220 are formed on the peripheral area PA.

The first electrode 221 and the second electrode 223 may form the first capacitor Cgs1, so that a first capacitance may be formed between the first electrode 221 and the second electrode 223.

An active pattern in which the amorphous silicon (a-Si:H) layer 133 and the amorphous silicon (n+a-Si) layer 134 doped with n type dopants at a high concentration is formed below the source pattern.

For example, a channel portion 130 including the activation layer 131 and the ohmic contact layer 132 is formed below a lower portion of the source electrode 113 and the drain electrode 115 of the pixel transistor TFT0 formed on the display area DA.

A channel portion 330 including the activation layer 331 and the ohmic contact layer 332 is formed below a lower portion of the source electrode 213 and the drain electrode 235 of the first transistor TFT1 formed on the peripheral area PA. Moreover, first and second active patterns 121 and 122 are formed below a portion of the second electrode 223 of the capacitor part 220 formed on the peripheral area PA.

Figure 11D:
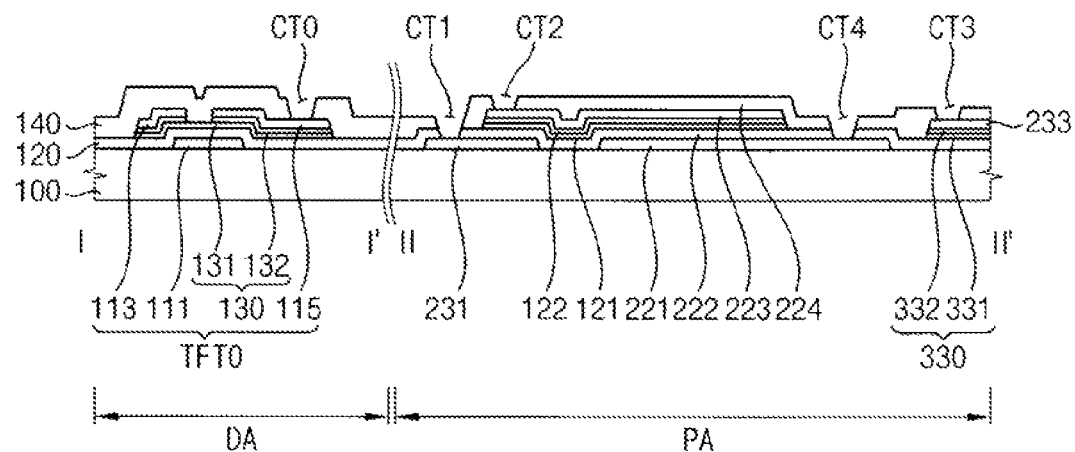

Referring to FIG. 11D, a passivation layer 140 is formed on the base substrate 100 on which the source pattern is formed, and then contact holes are formed through the gate insulation layer 120 and the passivation layer 140 via a photo-etching process using a third mask.

For example, a contact hole CT0 partially exposing the drain electrode 115 of the pixel transistor TFT0 of the display area DA is formed. Moreover, a first contact hole CT1 which partially exposes a gate electrode 231 of the first transistor TFT1 and a second contact hole CT2 which partially exposes the second electrode 223 to be adjacent to the first contact hole CT1 are formed through the gate insulation layer 120 and the passivation layer 140. Furthermore, a third contact hole CT3 which partially exposes a source electrode 233 of the first transistor TFT1 and a fourth contact hole CT4 which partially exposes the first electrode 221 to be adjacent to the third contact hole CT3 are formed through the gate insulation layer 120 and the passivation layer 140.

Figure 11E:
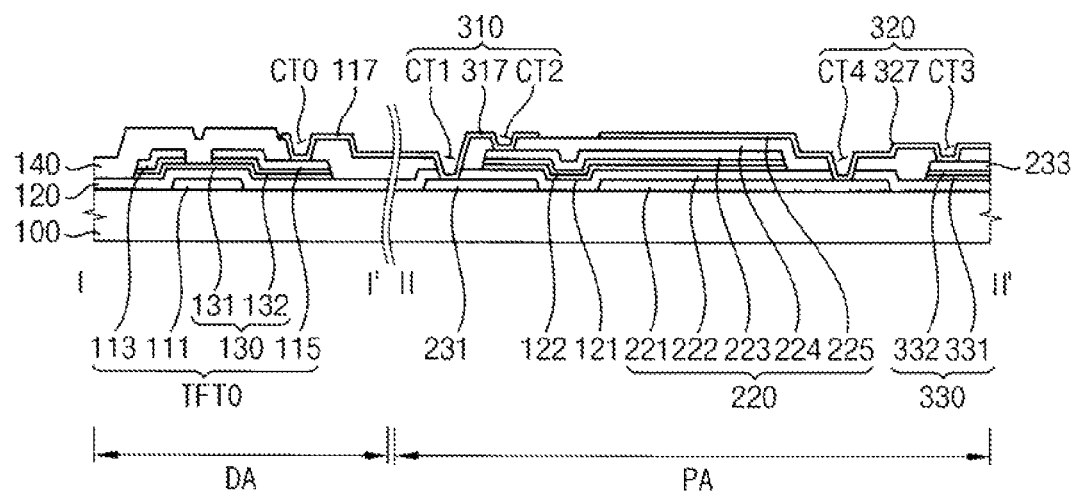

Referring to FIG. 11E, an optically transparent and electrically conductive material (not shown) is formed on the passivation layer 140 having the contact holes formed therethrough. The optically transparent and electrically conductive material may include an indium tin oxide (ITO) or an indium zinc oxide (IZO). Then, the optically transparent and electrically conductive material is etched through a fourth mask.

Thus, a pixel electrode 117 which makes contact with the drain electrode 115 of the pixel transistor TFT0 through the contact hole CT0 is formed on the display area DA. Moreover, a first bridge electrode 317 which connects the gate electrode 231 and the second electrode 223 through the first and second contact holes CT1 and CT2, respectively, and a second bridge electrode 327 which connects the source electrode 233 and the first electrode 221 through the third and fourth contact holes CT3 and CT4, respectively, are formed on the peripheral area PA. Furthermore, the third electrode 225 of the capacitor part 220 is formed thereon. The second bridge electrode 327 may be extended from the third electrode 225.

The second electrode 223 and the third electrode 225 form the second capacitor Cgs2, so that a second capacitance is formed between the second electrode 223 and the third electrode 225.

According to the present exemplary embodiment, the capacitor part 220 is formed in a parallel structure, so that an integrated size of the gate drive circuit 200 may be decreased. Moreover, the gate electrode 231 and the second electrode 223 are electrically connected to each other through the first connection part 310, and the source electrode 233 and the first electrode 221 are connected to each other through the second connection part 320.

Thus, the coupling capacitance does not affect the gate electrode 231 of the first transistor TFT1, so that the first transistor TFT1 may output a stable gate signal.

As described above, a capacitor part is formed in a parallel structure, so that an integrated size of a gate drive circuit may be decreased. Moreover, a coupling capacitance, which is generated between an electrode of a capacitor part connected to a gate electrode of a circuit transistor outputting a gate signal and a common electrode of an opposition substrate, is removed, so that a reliability of a gate drive circuit may be enhanced.

The foregoing is illustrative of the claimed subject matter and is not to be construed as limiting thereof. Although a few example embodiments of the have been described, those skilled in the art will readily appreciate that many modifications are possible in the example embodiments without materially departing from the novel teachings and advantages. Accordingly, all such modifications are intended to be included within the scope of the claimed subject matter as defined in the claims. In the claims, means-plus-function clauses are intended to cover the structures described herein as performing the recited function and not only structural equivalents but also equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of the appended claims. The claimed subject matter is defined by the following claims, with equivalents of the claims to be included therein.

What is claimed is:

1. A gate drive circuit in which plural stages are connected together one after each other, the plural stages configured to output a plurality of gate signals,
   each of the plural stages comprising:
      a circuit transistor configured to output the gate signal to an output terminal of the respective stage in response to a control signal applied through a gate electrode;
      a capacitor part formed adjacent to the circuit transistor and having two capacitors connected to the gate electrode of the circuit transistor and to the output terminal, the capacitor part comprising a first electrode, a second electrode formed on the first electrode, and a third electrode formed on the second electrode, the first, second and third electrode of the capacitor part being different from the gate electrode and a source electrode of the circuit transistor;
      a first connection part directly connecting the gate electrode of the circuit transistor and the second electrode of the capacitor part; and
      a second connection part directly connecting an output electrode of the circuit transistor and the first electrode of the capacitor part;
   wherein the third electrode is formed from a same layer as that of a pixel electrode.

2. The gate drive circuit of claim 1, wherein the gate signal outputted by the circuit transistor is outputted to the first electrode of the capacitor part through the second connection part.

3. The gate drive circuit of claim 1, further comprising:
   a first insulation layer formed between the first electrode of the capacitor part and the second electrode of the capacitor part; and
   a second insulation layer formed between the second electrode of the capacitor part and the third electrode of the capacitor part.

4. The gate drive circuit of claim 3, wherein the first connection part comprises: a first bridge electrode electrically connecting the gate electrode and the second electrode through a first contact hole exposing the gate electrode of the circuit transistor and a second contact hole exposing the second electrode of the capacitor part.

5. The gate drive circuit of claim 3, wherein the second connection part comprises: a second bridge electrode electrically connecting the output electrode of the circuit transistor and the first electrode through a third contact hole exposing the output electrode of the circuit transistor and a fourth contact hole exposing the first electrode of the capacitor part.

6. The gate drive circuit of claim 5, wherein the second bridge electrode is extended from the third electrode.

7. The gate drive circuit of claim 1, wherein the first electrode of the capacitor part and the gate electrode of the circuit transistor are formed from a same material.

8. The gate drive circuit of claim 1, wherein the second electrode of the capacitor part and the output electrode of the circuit transistor are formed from a same material.

9. A display substrate comprising:
  a base substrate comprising a display area and a peripheral area surrounding the display area;
  a pixel part formed on the display area, the pixel part comprising pixel transistors connected to gate lines and data lines and pixel electrodes connected to the pixel transistors; and
  a gate drive circuit formed on the peripheral area, the gate drive circuit having plural stages connected together one after each other, the plural stages configured to output a plurality of gate signals to the gate lines, each of the stages of the gate drive circuit comprising:
  a circuit transistor configured to output the gate signal to an output terminal of the respective stage in response to a control signal applied through a gate electrode;
  a capacitor part formed adjacent to the circuit transistor and having two capacitors connected to the gate electrode of the circuit transistor and to the output terminal, the capacitor part comprising a first electrode, a second electrode formed on the first electrode, and a third electrode formed on the second electrode, the first, second and third electrode of the capacitor part being different from the gate electrode and a source electrode of the circuit transistor;
  a first connection part directly connecting the gate electrode of the circuit transistor and the second electrode of the capacitor part; and
  a second connection part directly connecting an output electrode of the circuit transistor and the first electrode of the capacitor part;
  wherein the third electrode is formed from a same layer as that of a pixel electrode of the pixel part.

10. The display substrate of claim 9, wherein the gate signal outputted by the circuit transistor is outputted to the first electrode of the capacitor part through the second connection part.

11. The display substrate of claim 10, wherein the first electrode of the capacitor electrode part is extended from the gate line.

12. The display substrate of claim 9, wherein the gate drive circuit further comprises:
  a first insulation layer formed between the first electrode of the capacitor part and the second electrode of the capacitor part; and
  a second insulation layer formed between the second electrode of the capacitor part and the third electrode of the capacitor part.

13. The display substrate of claim 12, wherein the first connection part comprises: a first bridge electrode electrically connecting the gate electrode and the second electrode through a first contact hole exposing the gate electrode of the circuit transistor and a second contact hole exposing the second electrode of the capacitor part.

14. The display substrate of claim 12, wherein the second connection part comprises: a second bridge electrode electrically connecting the output electrode of the circuit transistor and the first electrode through a third contact hole exposing the output electrode of the circuit transistor and a fourth contact hole exposing the first electrode of the capacitor part.

15. The display substrate of claim 14, wherein the second bridge electrode is extended from the third electrode of the capacitor part.

16. The display substrate of claim 9, wherein the gate line, the first electrode of the capacitor part and the gate electrode of the circuit transistor are formed from a same material.

17. The display substrate of claim 9, wherein the data line, the second electrode of the capacitor part and the source electrode of the circuit transistor are formed from a same material.

18. The display substrate of claim 9, wherein the pixel electrode and the third electrode of the capacitor part are formed from a same material.

19. A method of manufacturing a display substrate, the method comprising:
  forming a gate pattern on a base substrate, the gate pattern comprising a gate line and a gate electrode of a pixel transistor on a display area of the base substrate, and a first electrode of a capacitor part and a gate electrode of a circuit transistor on a peripheral area surrounding the display area;
  forming a first insulation layer, a semiconductor pattern, an ohmic contact layer, and a source metal layer on the base substrate on which the gate pattern is formed;
  patterning the source metal layer to form a data line on the display area, drain/source electrodes of the pixel transistor on the display area, a second electrode of the capacitor part on the peripheral area and positioned over the first electrode of the capacitor part, drain/source electrodes of the circuit transistor on the peripheral area, and an active pattern below the source pattern;
  forming a second insulation layer on the base substrate on which the source pattern is formed; and
  forming a pixel electrode, a first connection part, a second connection part and a third electrode of the capacitor part on the display area, the peripheral area, the peripheral area and the peripheral area, respectively, the third electrode of the capacitor part being positioned over the first and second electrodes of the capacitor part so that the second electrode of the capacitor part is positioned between the first and third electrodes of the capacitor part, the pixel electrode being electrically connected to the drain electrode of the pixel transistor, the first connection part directly connecting the gate electrode of the circuit transistor and the second electrode of the capacitor part, and the second connection part electrically connecting the source electrode of the circuit transistor and the first electrode of the capacitor part,
  wherein the first, second and third electrodes of the capacitor part are different from the gate electrode and the source electrode of the circuit transistor.

20. The method of claim 19, wherein forming the first connection part and the second connection part comprises:
  partially removing the first insulation layer and the second insulation layer to expose the drain electrode of the pixel transistor, the gate electrode and the source electrode of the circuit transistor, and the first electrode and the second electrode of the capacitor part;

forming an optically transparent and electrically conductive material on the second insulation layer; and patterning the optically transparent and electrically conductive material to form the pixel electrode, the first connection part, the second connection part and the third electrode.

\* \* \* \* \*